(12) United States Patent
Hinrichs et al.

(10) Patent No.: US 7,031,395 B2
(45) Date of Patent: Apr. 18, 2006

(54) APPARATUS AND METHODS FOR DIGITAL-TO-ANALOG CONVERSION

(75) Inventors: Jeffrey M. Hinrichs, San Diego, CA (US); Brian J. Rosenkoetter, Herndon, VA (US); Robert R. Harnden, Redondo Beach, CA (US); Kenneth B. Weber, Redondo Beach, CA (US); Mark Kintis, Manhattan Beach, CA (US); Donald R. Martin, Redondo Beach, CA (US); William M. Skones, Manhattan Beach, CA (US); Kai E. Johnson, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 803 days.

(21) Appl. No.: 10/109,834

(22) Filed: Mar. 29, 2002

(65) Prior Publication Data

US 2003/0185288 A1 Oct. 2, 2003

(51) Int. Cl.
*H03M 3/00* (2006.01)
*H04B 14/06* (2006.01)

(52) U.S. Cl. ...................................... 375/245; 341/134
(58) Field of Classification Search ................ 375/245; 341/143, 144, 145, 146
See application file for complete search history.

(56) References Cited

U.S. PATENT DOCUMENTS 6,144,328 A * 11/2000 Eastty et al. ................ 341/143

6,339,621 B1 * 1/2002 Cojocaru et al. ........... 375/247

OTHER PUBLICATIONS

Splett A. et al, "Solutions for highly integrated future generation software radio basestation transceivers"; Proceedings of the IEEE 2001 Custom Integrated Circuits Conference, (CICC 2001), San Diego, CA, May 6-9, 2001, IEEE Custom Integrated Circuits Conference, CICC, New York, NY; IEEE, US, vol. Conf. 23, May 6, 2001, pp. 511-518.

Efstathiou D, "SoftCell TM/: A Multi-Carrier Transceiver Solution for Multi-Mode Base-Stations", 11$^{th}$ IEEE International Symposium on Personal Indoor and Mobile Radio Communications, PIMRC 2000. Proceedings (Cat. No. 00$^{TH}$8525), Proceedings of 11$^{th}$ International Symposium on Personal, Indoor and Mobile Radio Communication, London, UK, Sep. 18-21, pp. 469-473 vol. 1.

(Continued)

*Primary Examiner*—Kevin Kim
(74) *Attorney, Agent, or Firm*—Noel F. Heal

(57) ABSTRACT

An apparatus for converting a digital input signal to an analog signal for transmission. The input signal can include more than one carrier signal. A plurality of delta-sigma modulation loop circuits are connected in an increasing order of operating frequency so as to reduce a word length of the input signal. A tuning circuit adjusts the signal frequency to a transmitting frequency for conversion to analog by a digital-to-analog converter. A first loop circuit is implemented using CMOS gates, and a second loop circuit and the tuning circuit are implemented using indium phosphide gates. The apparatus allows a high-resolution, wideband RF multiple-carrier signal to be re-quantized to a lower-resolution signal while an acceptable signal-to-noise ratio is maintained.

26 Claims, 4 Drawing Sheets

OTHER PUBLICATIONS

Bindra A, "Wideband DAC Fosters Multicarrier, Multimode Transmission Novel 150-Msample/s, 14-BIT Segmented-current-source DAC boasts 75-DB SFDR over 25 MHZ cellular bandwith" Electronic Design, Pwnron Publishing, Cleveland, OH, vol. 47, No. 12, Jun. 14, 1999, pp. 37-38, 40.

Jensen, J.F. et al, "A 3.2-GHz Second-Order Delta-Sigma Modulator Implemented in InP HBT Technology", IEEE Journal of Solid-State Circuits, IEEE Inc. New York, vol. 30, No. 10, Oct. 1, 1995, pp. 1119-1127.

Vankka, J. et al, "A Multicarrier QAM Modulator", IEEE Transactions on Circuits and Systems II: Analog and Digital Signal Processing, IEEE Inc., New York, NY, vol. 47, No. 1, Jan. 2000, pp. 1-10.

Communication from European counterpart application No. 03 006 234.3.

* cited by examiner

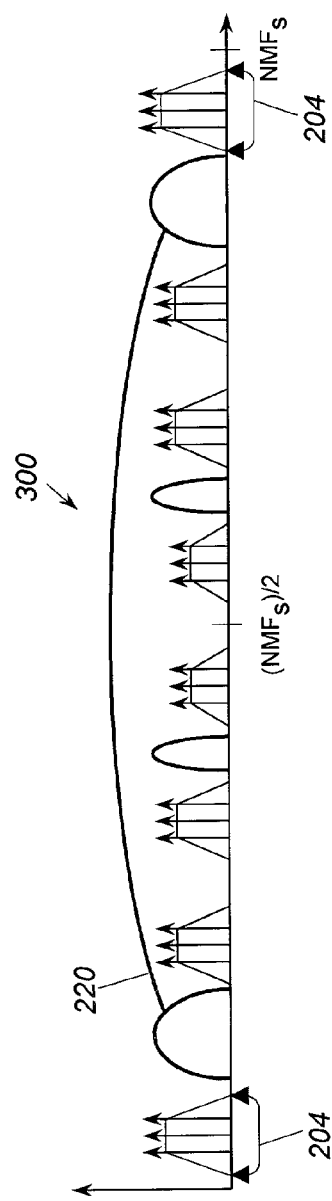
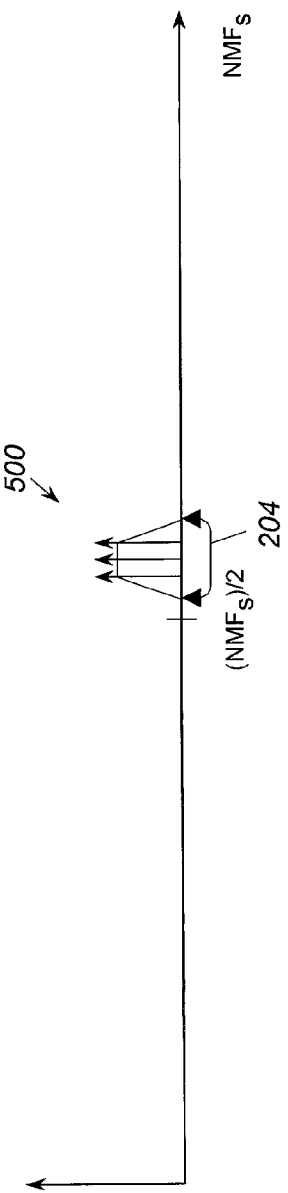
Figure 5
Figure 6
Figure 7

APPARATUS AND METHODS FOR DIGITAL-TO-ANALOG CONVERSION

BACKGROUND OF THE INVENTION

1 Field of the Invention

The present invention relates generally to digital-to-analog conversion and, more particularly, to an apparatus for digital-to-analog conversion via multiple stages of delta-sigma modulation.

2. Discussion of the Related Art

Base stations for wireless telephone networks typically have a plurality of transmitters, each transmitter being able to transmit only one carrier at a time. It currently is not feasible for a transmitter to transmit multiple carriers simultaneously because digital-to-analog converters (DACs) currently utilized in the transmitters do not provide enough bandwidth with signal-to-noise ratios (SNRs) high enough to support multiple transmissions and still comply with FCC noise limitations. Thus current methods for converting an RF multi-carrier signal for transmission involve breaking up the RF signal band into smaller sub-bands. Each sub-band is converted to an analog signal using a digital-to-analog converter (DAC). The frequency value of the DAC output is adjusted using a conventional mixer with a local oscillator (LO) source. LO sources and mixers, however, can drift in frequency with changes in temperature.

There is a need for a low-cost signal modulator for processing RF multi-carrier waveforms for transmission. It would be desirable for such a modulator to operate over a wide bandwidth yet occupy little circuit "real estate". Delta-sigma modulation techniques are known in connection with signal conversion; however, delta-sigma modulation has been impractical for commercial RF applications such as cellular networks. For example, a delta-sigma modulator with sixteen-bit input samples implemented in indium phosphide (InP) high-speed digital logic circuitry would occupy a relatively small amount of circuit "real estate". Fabricating such circuitry would be prohibitively expensive, however, because of the high cost, and low circuit yield of indium phosphide wafer production. In contrast producing a sixteen-bit delta-sigma modulator using slower complementary metal-oxide semiconductor (CMOS) technology would cost less than indium phosphide, at a higher percent transistor yield, per wafer. Such a CMOS-based chip, however, would require operation at clock rates which are beyond state of the art for commercial CMOS technology.

BRIEF SUMMARY OF THE INVENTION

In one embodiment, the present invention is directed to an apparatus for converting a digital input signal to an analog signal for transmission, wherein the input signal can include more than one carrier signal. The apparatus includes a plurality of delta-sigma modulation loop circuits, each loop circuit having an operating frequency, wherein the loop circuits are connected in an increasing order of operating frequency so as to reduce a word length of the input signal to obtain a digital signal having a reduced word length. A tuning circuit adjusts a frequency of the digital signal to a transmitting frequency. A digital-to-analog converter converts the frequency-adjusted digital signal to an analog signal.

In one preferred form, a first delta-sigma modulation loop circuit is implemented using CMOS gates, and a second delta-sigma modulation loop circuit and the tuning circuit are implemented using indium phosphide gates. In this preferred embodiment, the first and second loop circuits are connected in an order of decreasing loop order. The above-described apparatus allows a high-resolution wide-band RF multiple-carrier signal to be quantized down to a lower-resolution signal while an acceptable signal-to-noise ratio is maintained. The apparatus occupies less circuit "real estate" than would a conversion circuit implemented totally in CMOS, yet is less costly than a circuit implemented totally in indium phosphide.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 5 is a diagram of quantization noise relative to the representative spectrum shown in FIG. 4;

FIG. 6 is a diagram of a representative signal spectrum generated after tuning via a tuning operator; and FIG. 7 is a diagram of a representative analog spectrum of a signal after filtering via a band-pass filter.

DETAILED DESCRIPTION OF THE INVENTION

The following description of the preferred embodiments is merely exemplary in nature and is in no way intended to limit the invention, its application, or uses.

Figure 1:
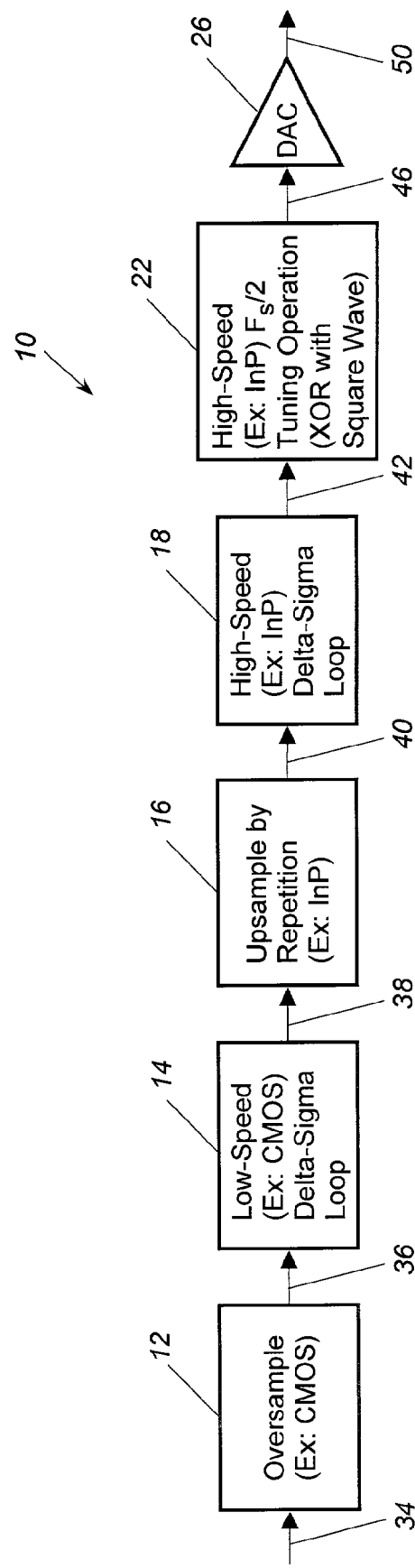
FIG. 1 is a diagram of an embodiment of a multiple-stage delta-sigma digital-to-analog conversion circuit.

A preferred embodiment of a multiple-stage delta-sigma digital-to-analog conversion circuit is generally indicated in FIG. 1 by reference number 10. The conversion circuit or apparatus 10 includes an over-sampling circuit 12 that precedes a low-speed delta-sigma loop circuit 14. The loop circuit 14 is followed by an up-sampling circuit 16, a high-speed delta-sigma loop circuit 18, a high-speed tuning operator or circuit 22, and a one-bit digital-to-analog converter (DAC) 26. The terms "low-speed" and "high-speed" are used herein in a relative sense to refer to the frequencies of technologies respectively utilized in implementing embodiments of the invention. For example, the delta-sigma loop 14 in one embodiment is implemented using complementary metal-oxide semiconductor (CMOS) hardware, and the delta-sigma loop 18 and tuning operator 22 are implemented in indium phosphide (InP) hardware, which is faster than CMOS. The delta-sigma loop 14 preferably has an order higher than the order of the delta-sigma loop 18. As shall be further described below, the lower-speed, higher-order loop 14 and the higher-speed, lower-order loop 18 are cascaded to reduce the number of bits per sample of a digital multiple-carrier signal so that the signal can be entirely digitally tuned for analog transmission.

Operation of the circuit 10 shall now be described. A multiple-carrier digital signal 34, produced by a modulator block (not shown) as known in the art, is input to the over-sampling circuit 12. The base-band signal 34 is over-sampled by a factor of M to produce a signal 36. The amount of over-sampling is based at least in part on a speed of the loop 14 relative to the loop 18 and dependent, for example, on the hardware(s) in which the loops 14 and 18 are implemented. The signal 36 is input to the low-frequency delta-sigma loop 14 at a sampling rate $MF_s$ mega-samples per second (Msps), which is greater than or equal to the applicable Nyquist rate.

The delta-sigma loop 14 operates to reduce the resolution of the input signal 36. Where the input signal 36 has B bits per word (or equivalently, B bits per sample), the delta-sigma loop 14 operates to reduce the digital word width B of the signal 36 by b bits, thus producing a digital signal 38 having B-b bits per word. The number of bits b by which the signal width is reduced depends at least in part on the order of the loop 14. The delta-sigma loop 14 also operates as a low-pass digital filter. That is, as the input signal is processed through the loop 14, essentially the multi-carrier signal is accumulated while quantization noise is differentiated. Thus, as shall be further described below, loop feedback and over-sampling serve to shift quantization noise away from the multi-carrier signal 36 frequency band.

The signal 38 output by the loop circuit 14 is input to the up-sampling circuit 16 and is up-sampled by a factor of N. The up-sampling is accomplished by sample repetition, that is, by generating copies of the signal 38 in the frequency domain at multiples of the sampling frequency $M \times F_s$ Msps. The signal 38 is up-sampled by the up-sampling factor N based at least in part on a speed of the loop 18 relative to the loop 14 and dependent, for example, on the hardware(s) in which the loops 14 and 18 are implemented. The up-sampling circuit 16 produces a signal 40 that is input to the delta-sigma loop 18.

The delta-sigma loop 18 operates at a sampling rate of $M \times N \times F_s$ Msps and reduces the digital word width B-b of the signal 40 by (B-b-1) bits. The delta-sigma loop 18 also acts as a low-pass digital filter. More specifically, loop feedback and over-sampling serve to shift quantization noise to higher frequencies relative to the multi-carrier signal frequency band that is input to the tuning operator 22 as described below. The loop 18 produces a digital signal 42 having one bit per word.

The signal 42 is input to the high-speed tuning circuit or operator 22 at the sampling rate of $M \times N \times F_s$ Msps. The tuning operator 22 adjusts the frequency of the signal 42 to produce a signal 46 having a desired transmission radiofrequency. For example, the tuning operator 22 performs an exclusive OR ("bit flipping") operation on the baseband signal 42 using a zero-DC square wave signal having a frequency of one-half the sampling rate of $M \times N \times F_s$ Msps. The tuning operator 22 thus up-converts the signal to the desired radiofrequency. The digital one-bit-wide signal 46 is converted to an analog signal 50 via the one-bit digital-to-analog converter (DAC) 26. The analog signal 50 is further filtered as shall be described below.

In other embodiments, the signal 42 can have a word length of more than one bit per word. For example, the signal 42 could be assigned two bits per sample. Such a multi-bit data stream could be tuned using appropriate combinational logic to negate alternate samples from the data stream. A four-level DAC would be used to convert the two-bits-per-sample signal. Mismatch shaping, as known in the art, could be used to counteract any effects of circuit mismatch. For example, mixmatch-shaping logic could be used to choose in a data-dependent manner between four single-bit DACs. The analog output of the four single-bit DACs are then summed to form the signal 50.

Figure 2:
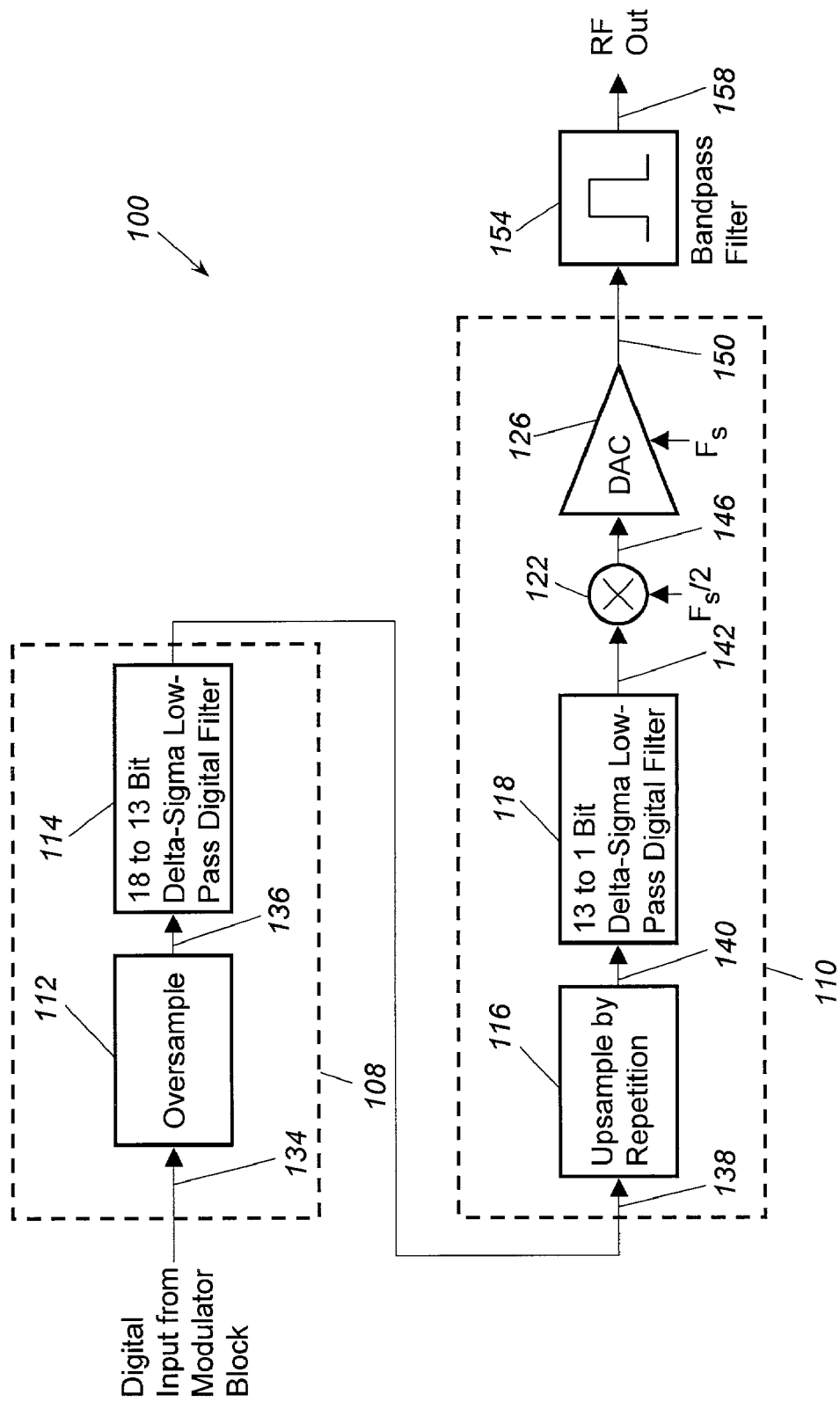
FIG. 2 is a diagram of an embodiment of a multiple-stage delta-sigma digital-to-analog conversion circuit.
Figure 3:
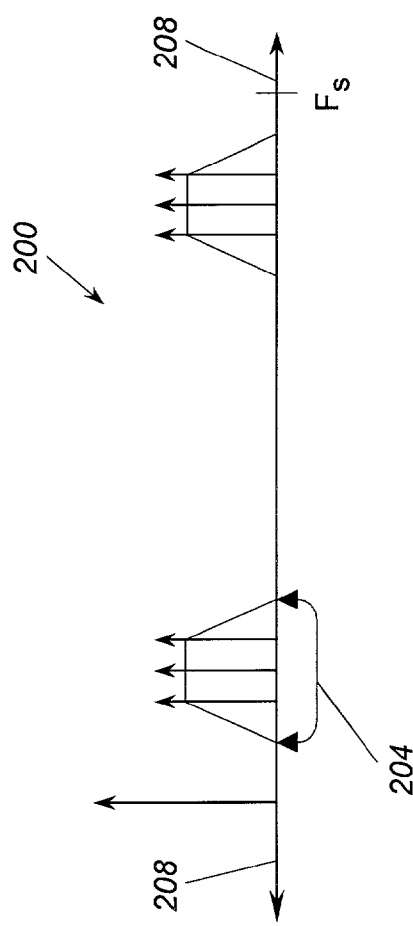
FIG. 3 is a diagram of a representative spectrum of a multiple-carrier modulated signal input to a high-order delta-sigma loop in one embodiment.

FIG. 2 illustrates an exemplary conversion circuit or apparatus 100. The circuit 100 shall now be described in connection with processing of a multiple-carrier signal 134 having, for example, eighteen bits per word and a bandwidth of 25 MHz. A CMOS-based application-specific integrated circuit (ASIC) 108 includes an over-sampling circuit 112 and a delta-sigma loop 114, for example, a fifth-order CMOS-based loop. An InP-based application-specific integrated circuit (ASIC) 110 includes an up-sampling circuit 116 and a delta-signal loop 118, for example, a third-order InP-based loop. Also included in the ASIC 110 are a tuning operator 122 and a DAC 126. Embodiments also are contemplated having alternative numbers and orders of delta-sigma loops and alternative combinations of orders of such loops, including but not limited to two loop circuits connected in an increasing order of loop order and/or two loop circuits having equal loop orders.

The signal 134 is input to the over-sampling circuit 112. An over-sampled signal 136 is input to the delta-sigma loop 114 at a sampling rate of 116.125 Msps. The loop 114 operates to reduce the word width of the signal 136 to thirteen bits per word. The loop 114 produces a thirteen-bit-per-word signal 138 having a sampling rate of 116.125 Msps and a bandwidth of 25 MHz.

The signal 138 is input to the up-sampling circuit 116 and is up-sampled by repetition, that is, by generating copies in the frequency domain of the signal 138 at multiples of the low-speed sampling frequency of 116.125 Msps. An up-sampled signal 140 is input to the delta-sigma loop 118. The loop 118 operates to further reduce the multiple-carrier signal word width to one bit. More specifically, the signal 138 is up-sampled by an up-sampling factor of sixteen to produce a one-bit-wide signal 142 having a sampling rate of 1858 Msps.

The signal 142 is input to the tuning operator 122 at the sampling rate of 1858 Msps. The tuning operator 122 multiplies the baseband signal 142 with a zero-DC square wave signal having a frequency of 929 MHz, i.e. one-half the sampling rate of 1858 Msps. A signal 146 is produced having a transmission radiofrequency centered about 942.5 MHz, which is the center of the GSM 900 band. The tuning operator 122 thus up-converts the signal to the desired radiofrequency. The one-bit digital-to-analog converter (DAC) 126 converts the signal 146 to an analog signal 150. The analog signal 150 is further filtered using a bandpass filter 154 to produce a transmission signal 158 having a bandwidth of 25 MHZ.

FIGS. 3 through 7 illustrate representative spectra at various points in the modulation of a transmission signal by the circuit 10 (shown in FIG. 1). (It should be noted that FIGS. 3 through 7 are not drawn to scale.) The multiple-carrier modulated signal 34, input to the high-order delta-sigma loop 14 after over-sampling, is represented by a spectrum indicated generally in FIG. 3 by reference number 200. A signal band 204 is repeated along the axis 208 of the spectrum 200. In accordance with the sampling theorem, the sampling frequency $F_s$ is greater than twice the signal bandwidth 204.

Figure 4:
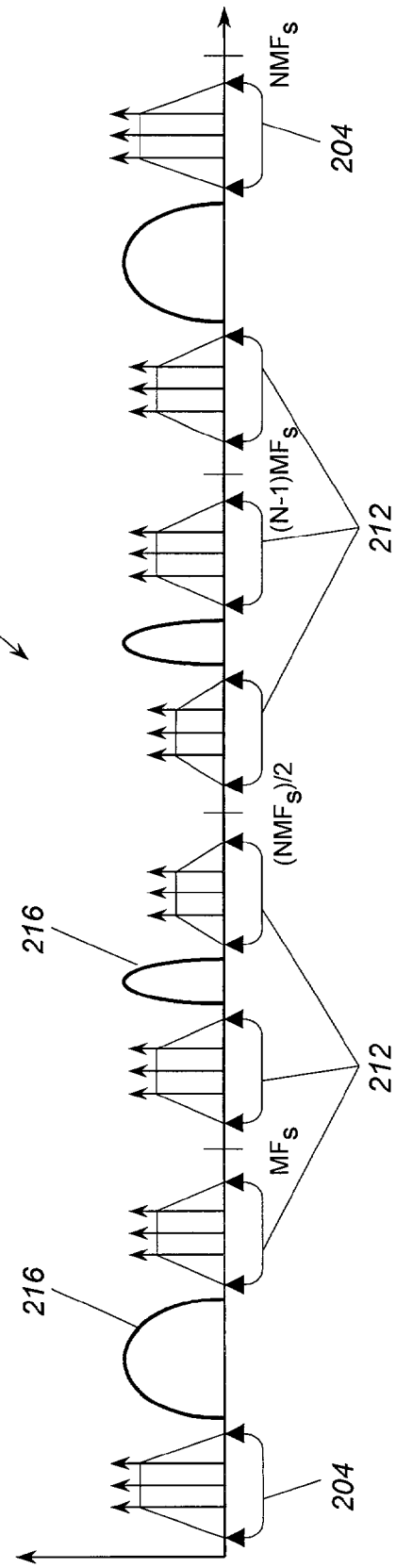
FIG. 4 is a diagram of a representative signal spectrum generated in a low-order delta-sigma loop.

A representative spectrum input to the low-order delta-sigma loop 18 at the sampling rate of $M \times N \times F_s$ Msps is indicated generally in FIG. 4 by reference number 300. The up-sampled signal band 204 is repeated via weighted copies 212 at multiples of the sampling frequency $M \times F_s$ Msps.

Quantization noise 216, frequency-shifted via the high-order loop 14, also appears in the spectrum 300. FIG. 5 illustrates quantization noise 220, relative to the representative spectrum 300, that is frequency-shifted about the frequency M×N×$F_s$/2 during loop 18 operation.

A representative spectrum, at the sampling rate of M×N×$F_s$ Msps, after tuning via the tuning operator 22 is indicated generally in FIG. 6 by reference number 400. The signal bands 204 are symmetrically centered about the frequency M×N×$F_s$/2 as result of multiplication with a square wave as previously described. FIG. 7 illustrates an analog spectrum 500 in which the signal 204 is shown after being filtered via the band-pass filter 154 (shown in FIG. 2).

From the foregoing description of conversion circuit embodiments, it can be seen that a method also is described for converting a digital input signal to an analog signal for transmission, wherein the input signal can include more than one carrier signal. The method includes the step of reducing a digital word length of the input signal to an intermediate word length. The foregoing step is performed using a first delta-sigma loop. The method further includes reducing the intermediate word length to produce a digital signal having a reduced word length, said step performed using another delta-sigma loop. The delta-sigma loops preferably are used in an order of decreasing loop order. A frequency of the digital signal is adjusted to a transmitting frequency, and the frequency-adjusted digital signal is converted to an analog signal.

The quantization noise from the low-frequency loop 14 serves as a source of noise-shaped dither for the high-frequency loop 18, thus aiding in the removal of any idle channel tones that might appear in the signal band when there is a zero or DC input. Additionally, because the tuning circuit 22 up-converts a signal to a radiofrequency, the high-frequency loop 18 can be implemented as a low-pass design incorporating fewer transistors than would be used in other circuit architectures. The above-described apparatus allows a high-resolution wide-band RF multiple-carrier signal to be quantized down to a lower-resolution signal while an acceptable signal-to-noise ratio is maintained. The apparatus occupies less circuit "real estate" than would a conversion circuit implemented totally in CMOS, yet is less costly than a circuit implemented totally in indium phosphide. Because frequency tuning can be performed digitally, the above apparatus provides better temperature stability that would be achievable using a local oscillator source and mixer. Additionally, the above apparatus enables a multiple-carrier signal to be transmitted without being subdivided into sub-bands.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus for converting a digital input signal to an analog signal for transmission, wherein the input signal can include more than one carrier signal, the apparatus comprising:
   a plurality of delta-sigma modulation loop circuits, each loop circuit comprising an operating frequency, wherein the loop circuits are connected in an increasing order of operating frequency so as to reduce a word length of the input signal to obtain a digital signal having a reduced word length;
   a tuning circuit configured to adjust a frequency of the digital signal to a transmitting frequency; and
   a digital-to-analog converter configured to convert the frequency-adjusted digital signal to an analog signal.

2. The apparatus of claim 1 further comprising an output filter configured to filter the analog signal.

3. The apparatus of claim 1 comprising two loop circuits connected in a decreasing order of loop order.

4. The apparatus of claim 3 wherein the loop circuits comprise a fifth-order loop circuit and a third-order loop circuit configured to process an output signal from the fifth-order loop circuit.

5. The apparatus of claim 1 comprising two loop circuits connected in an increasing order of loop order.

6. The apparatus of claim 1 comprising two loop circuits having equal loop orders.

7. The apparatus of claim 1 wherein the reduced word length of the digital signal comprises a one-bit word length.

8. The apparatus of claim 1 wherein a first of the loop circuits is configured to reduce the word length of the input signal to an intermediate word length.

9. The apparatus of claim 8 wherein the word length of the input signal comprises eighteen bits and the intermediate word length comprises thirteen bits.

10. The apparatus of claim 8 wherein a second of the loop circuits is configured to reduce the intermediate word length to the reduced word length.

11. The apparatus of claim 1 wherein a first of the loop circuits comprises complementary metal-oxide semiconductor gates and a second of the loop circuits comprises indium phosphide gates.

12. The apparatus of claim 1 wherein the tuning circuit is configured to adjust the digital signal frequency using an exclusive OR operation.

13. A method for converting a digit input signal to an analog signal for transmission, wherein the input signal can include more than one carrier signal, the method comprising the steps of:
   reducing a digital word length of the input signal to an intermediate word length, said step performed using a delta-signal loop;
   reducing the intermediate word length to produce a digital signal having a reduced word length, said step performed using another delta-sigma loop, wherein the step of reducing the intermediate word-length is performed at a frequency higher than a frequency at which the step of reducing a digital word length of the input signal is performed;
   adjusting a frequency of the digital signal to a transmitting frequency; and
   converting the frequency-adjusted digital signal to an analog signal.

14. The method of claim 13 further comprising the step of filtering the analog signal to produce a transmission signal.

15. The method of claim 13 wherein the digital word length of the input signal is eighteen bits, and the step of reducing a digital word length of the input signal to an intermediate word length comprises reducing the digital word length thirteen bits.

16. The method of claim 13 wherein the step of reducing the intermediate word length comprises producing a digital signal having a reduced word length of one bit.

17. The method of claim 13 wherein the step of adjusting a frequency of the digital signal comprises multiplying the digital signal by a square wave having a frequency of one-half the digital signal frequency.

18. The method of claim 13 wherein the delta-sigma loops are used in an order of decreasing loop order.

19. The method of claim 13 wherein the step of reducing a digital word length of the input signal comprises oversampling the input signal for input to a first delta-sigma loop.

20. The method of claim 13 wherein the step of reducing the intermediate word length comprises up-sampling an intermediate-word-length signal for input to a second delta-sigma loop.

21. A method for configuring a signal conversion apparatus for use in a radiofrequency transmitter, the method comprising the steps of:
   implementing a delta-sigma loop for operation at a given frequency to reduce a word length of a digital input signal to an intermediate-length;
   implementing another delta-sigma loop for operation at a higher frequency than the given frequency to reduce the intermediate length to a reduced word length; and
   implementing a digital tuner for up-converting the signal to a transmission radiofrequency.

22. The method of claim 21 wherein the step of implementing a delta-sigma loop to reduce a word length to an intermediate length is performed using complementary metal-oxide semiconductor gates.

23. The method of claim 22 comprising the step of implementing a fifth-order delta-sigma loop.

24. The method of claim 21 wherein the step of implementing another delta-sigma loop to reduce the intermediate length to a reduced word length is performed using indium phosphide gates.

25. The method of claim 24 comprising the step of implementing a third-order delta-sigma loop.

26. The method of claim 21 further comprising the step of implementing the digital tuner and a digital-to-analog converter for operation at the higher frequency.

* * * * *